(12) United States Patent
Yang et al.

(10) Patent No.: US 12,206,233 B2
(45) Date of Patent: Jan. 21, 2025

(54) LEAKAGE CURRENT DETECTION CIRCUIT

(71) Applicant: DongGuan City TuoCheng Industries Co., Ltd., Dongguan (CN)

(72) Inventors: Juntuo Yang, Dongguan (CN); Dong Wei, Dongguan (CN)

(73) Assignee: DongGuan City TuoCheng Industries Co., Ltd., DongGuan (CN)

( * ) Notice: Subject to any disclaimer, the term of this patent is extended or adjusted under 35 U.S.C. 154(b) by 252 days.

(21) Appl. No.: 17/839,582

(22) Filed: Jun. 14, 2022

(65) Prior Publication Data

US 2023/0344215 A1    Oct. 26, 2023

(30) Foreign Application Priority Data

Apr. 21, 2022  (CN) .......................... 202220938204.X

(51) Int. Cl.
*H02H 3/16* (2006.01)
*G01R 31/52* (2020.01)

(52) U.S. Cl.
CPC ............... *H02H 3/16* (2013.01); *G01R 31/52* (2020.01)

(58) Field of Classification Search
CPC .......... H02H 3/16; H02H 3/325; G01R 31/52
USPC ........................................................ 361/42
See application file for complete search history.

(56) References Cited

U.S. PATENT DOCUMENTS

| | | | |
|---|---|---|---|
| 4,205,358 A * | 5/1980 | Washington ........... | H02H 3/347 361/45 |
| 5,999,384 A * | 12/1999 | Chen .................... | H02H 1/0015 361/93.6 |
| 6,010,788 A | 1/2000 | Kebabjian et al. | |
| 6,738,241 B1 * | 5/2004 | Aromin ................ | H02H 1/0015 361/45 |
| 9,934,888 B2 | 4/2018 | Yoshino et al. | |
| 10,333,263 B2 | 6/2019 | Wu et al. | |
| 2005/0243484 A1 * | 11/2005 | Kim ....................... | H02H 3/335 361/42 |
| 2006/0203402 A1 * | 9/2006 | Aromin ................ | H02H 1/0015 361/42 |
| 2008/0251274 A1 | 10/2008 | Lee et al. | |
| 2015/0349512 A1 * | 12/2015 | Li ............................ | H02H 5/04 361/47 |
| 2019/0165567 A1 * | 5/2019 | Aromin .............. | H01R 13/6683 |

FOREIGN PATENT DOCUMENTS

| | | | | |
|---|---|---|---|---|
| CA | 2066515 C | * | 12/2001 | ............. H02H 3/331 |
| CN | 105017676 | | 11/2015 | |
| CN | 109337231 | | 2/2019 | |

* cited by examiner

*Primary Examiner* — Dharti H Patel

(74) *Attorney, Agent, or Firm* — Nitin Kaushik

(57) ABSTRACT

The present invention relates to the technical field of leakage protection, in particular to a leakage current detection circuit and a device thereof. The connected S1 inductive terminal and the S2 inductive terminal can be signal-connected, and the driving module detects whether the S1 inductive terminal and the S2 inductive terminal are connected by a signal. There is a connection signal to judge whether there is leakage, and the drive module turns the switch module on or off to control whether the circuit breaker generates a circuit breaker signal, and then the main switch S can be disconnected when leakage occurs to ensure the safety of electricity use. There is no need to set up a transformer. Reduced volume, simple circuit structure, and easier production.

11 Claims, 12 Drawing Sheets

LEAKAGE CURRENT DETECTION CIRCUIT

FIELD

The present invention relates the technical field of leakage protection, in particular to a leakage current detection circuit and a device thereof.

BACKGROUND

The plug structure of leakage current detection is a gradually increasing application in life, which can effectively improve the safely of electricity consumption in life and public environment. Most of the current leakage current detection circuit structures still need to set up transformers on the output line and various chip control structures that cooperate with the transformers. Although the purpose of leakage detection and power failure can be achieved, the transformers are bulky and occupy space. It is also large, so the weight and volume of the plug will increase, and because of the many circuit structures, the lines on the control circuit board are more complicated, the design is troublesome, the production is complicated, the production efficiency is also low, and the cost is higher.

SUMMARY OF THE DISCLOSURE

Aiming at the problems presented in the prior art, the invention provides a leakage current detection circuit and a device thereof, which does not need to set the structure of a transformer, and uses the connected S1 inductive terminal and S2 inductive terminal as a leakage inductive signal, and has a drive module to control the switch The on and off of the module, and then control the work of the circuit breaker, realize the purpose of leakage current detection and power off, and the circuit layout is simpler.

To solve the problems as described in the previous paragraphs, the present invention provides a leakage current detection circuit including an input terminal L, an input terminal N, an output terminal LO and an output terminal NO, characterizing in that: the circuit also includes a main switch S, a drive module, a switch module and a circuit breaker, and the drive module is provided with S1 sensing end and S2 sensing end, S1 sensing end and S2 sensing end signal connection; the input terminal L is connected to the output terminal LO through the main switch S, and the input terminal N is connected to the output terminal NO through the main switch S; the input end of the drive module is connected to the output terminal LO, the output end of the drive module is connected to the control end of the switch module, and the drive module is used to determine whether the S1 sensing end and the S2 sensing end are connected the signal of the switch module is used to control the opening and closing of the switch module; the input end of the switch module is connected to the output terminal LO, the output end of the switch module is connected to a voltage end of the circuit breaker, and the circuit breaker, the other voltage end of the circuit breaker is connected to the output terminal NO, and the control end of the circuit breaker is connected to the control end of the main switch S and used to control the on and off of the main switch S.

Preferably, the circuit is characterized in that: the switch module includes a switch tube Q1 and a switch tube Q2; a switch end of the switch tube Q1 is connected to a voltage end of the circuit breaker, and the other switch end of the switch tube Q1 is connected to the output terminal LO, the control end of the switch tube Q1 is connected to the output end of the drive module; a switch end of the switch tube Q2 is connected to a voltage end of the circuit breaker, and the other switch end of the switch tube Q2 is connected to the output terminal LO, the control end of the switch tube Q2 is connected to the output end of the driving module.

Preferably, the circuit is characterized in that: the drive module includes a switch tube Q3, a resistor R5, a resistor R7, a resistor R9, a resistor R11, a resistor R10, a diode D7 and a diode D6; one end of the resistor R7 is connected to the output terminal LO through the diode D6, the other end of the resistor R7 is connected to a switch end of the switch tube Q3 through the resistor R9, and the other switch end of the switch tube Q3 is connected to the control end of the switch module, the control terminal of the tube Q3 is connected to the output terminal NO through the diode D7 and the resistor R11 in turn, and the two ends of the resistor R5 are respectively connected to a voltage terminal of the circuit breaker and the other switch terminal of the switch tube Q3; the S1 sensing terminal is connected to one end of the resistor R7 through the resistor R10, and the S2 sensing terminal is connected to the cathode of the diode D7.

Preferably, the circuit is characterized in that: the drive module also includes a diode D10 and a resistor R3, one end of the diode D10 is connected to the cathode of the diode D7, and the other end of the diode D10 is connected to the control end of the switch module through the resistor R3.

Preferably, the circuit is characterized in that: the input terminal N is connected to the rectifier D1 through the main switch S, the switch module includes a diode SCR1 and a diode SCR2, the anode of the diode SCR1 is connected to the output of the rectifier D1, the cathode of the diode SCR1 is grounded, and the control end of the diode SCR1 is connected to the output end of the drive module is connected, the anode of the diode SCR2 is connected to the output of the rectifier D1, the cathode of the diode SCR2 is connected to the ground, and the control end of the diode SCR2 is connected to the output end of the drive module.

Preferably, the circuit is characterized in that: the drive module includes a resistor R15, a resistor R18, a resistor R14 and a resistor R17, the output of the rectifier D1 is connected to the control terminal of the diode SCR1 after passing through the resistor R18 and the resistor R15 in sequence, the control terminal of the diode SCR2 is grounded through the resistor R14 and the resistor R17 in turn, and the connection terminal of the resistor R14 and the resistor R17 is connected to the S2 sensing terminal.

Preferably, the circuit is characterized in that: a cable is connected between the input terminal L and the output terminal LO, and between the input terminal N and the output terminal NO, the outer circumference of the cable is wrapped with a conductive layer, and the conductive layer is connected to the S1 sensing terminal or S2.

To solve the problems as described in the previous paragraphs, the present invention provides A leakage current detection device, comprising a casing and a plurality of pins, characterized in that: it also includes a control circuit board, a plurality of cable connectors and a plurality of conductive output parts arranged in the casing, and the control circuit board is provided with the above circuit described in any of claim 1 to claim 7; the plurality of pins are respectively connected to the input terminal L and the input terminal N, the plurality of cable connectors are respectively connected to the output terminal LO and the output terminal NO, and the conductive output member is the main switch S; a plurality of the conductive output pieces are in one-to-one correspondence with a plurality of the pins, one end of the conductive output piece is used for signal connection with the pin, and the other end of the conductive output piece is welded with the cable connector; the outer shell includes an upper shell and a lower shell, the lower shell is protruded with a fixing column, the upper shell is provided with a groove, and the fixing column is assembled in the groove and forms a locking position with the groove bottom of the groove, the other end of the conductive output piece is inserted into the card position.

Preferably, the circuit is characterized in that the leakage current detection device further comprises a button arranged on the casing, the button is used to control whether the conductive output member is connected with the pin and outputs a voltage and current signal; a waterproof assembly is installed in the casing, and the waterproof assembly includes a waterproof gasket; a fixing seat is installed in the outer casing, the fixing seat is detachably installed on the lower casing, and the waterproof gasket is installed on the lower casing, between the fixing seat and the lower shell, the lower shell is provided with a button hole for the button to be exposed, and the waterproof gasket is used for sealing and isolating the button hole and the inner space of the shell; the waterproof gasket is equipped with a U-shaped elastic ring, the U-shaped elastic ring is provided with a through hole, the hole wall of the through hole is provided with a limiting groove, the outer periphery of the button is equipped with a limiting ring, and the button after passing through the through hole, the limiting ring is assembled in the limiting groove; the waterproof gasket is protruded with a sealing rib, and the sealing rib is used to abut against the inner wall of the lower case.

Preferably, the circuit is characterized in that: a The leakage current detection device is further provided with a leakage detection circuit breaker assembly, the leakage circuit breaker assembly includes a circuit breaker bracket, a connector, a connection reset component and a button reset component, the pins are provided with fixed contacts; the button reset component is sleeved on the periphery of the button and used to reset the button, and the connection reset piece is used to reset the connection piece; the circuit breaker is installed on the control circuit board and is signally connected to the control circuit board, the connector is movably installed on the circuit breaker bracket, and the output end of the circuit breaker is installed on the connector and used to drive the movement of the connector; both sides of the circuit breaker support are provided with control arms, the connecting piece is provided with a driving slot and the bottom of the key is provided with a clamping slot; when the key is closed, the slot wall of the driving slot is clamped in the position, the connecting piece is used to drive the circuit breaker support to move, and the control arm of the circuit breaker support is used to drive the conductive output piece to contact the fixed contact.

Figure 1:
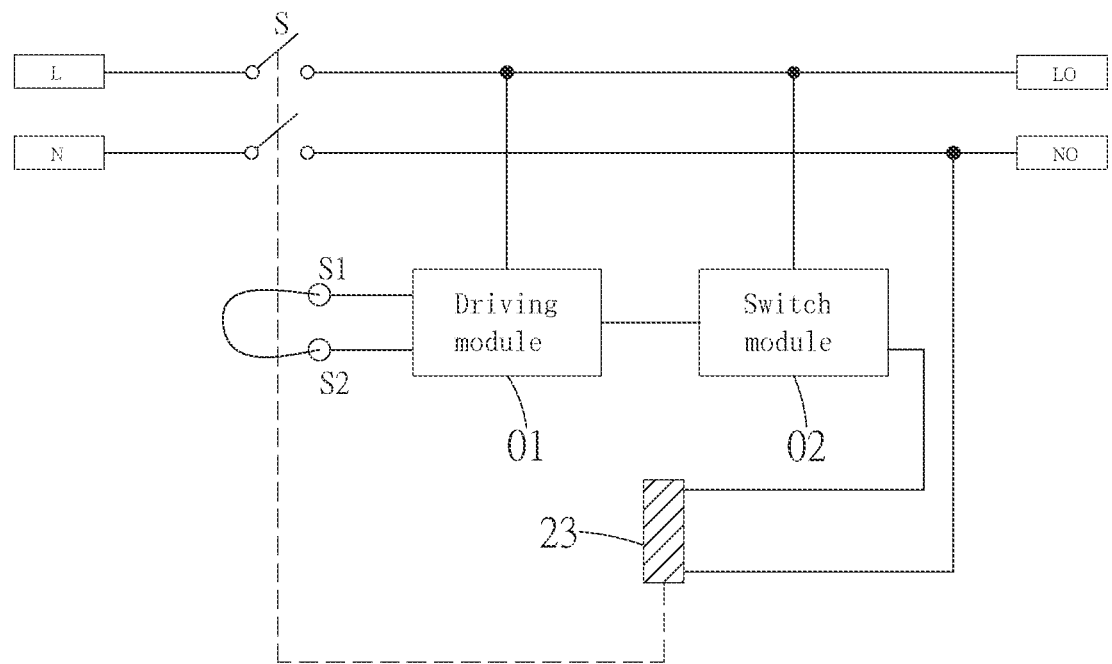
FIG. 1 is the signal block diagram of the present invention.

Reference numerals in FIGS. 1 to 13 include:
01—drive module, 02—switch module, 1—upper shell, 2—lower shell, 3—pin, 4—control circuit board, 5—cable connector, 6—conductive output piece, 7—button, 8—fixed Column, 9—groove, 10—card position, 11—rib ring, 12—connection groove, 13—waterproof gasket, 14—fixed seat, 15—key hole, 16—U-shaped elastic ring, 17—via hole, 18—limit ring, 19—limit groove, 20—sealing rib, 21—circle, 23—breaker, 24—breaker bracket, 25—connector, 26—connection reset, 27—key reset, 28—fixed contact, 29—control arm, 30—drive slot, 31—card slot, 32—through slot, 33—limiting bump.

DETAILED DESCRIPTION

In order to facilitate the understanding of those skilled in the art, the present invention will be further described below with reference to the embodiments and the accompanying drawings, and the contents mentioned in the embodiments are not intended to limit the present invention. The present invention will be described in detail below in conjunction with the accompanying drawings.

Embodiment 1

A leakage current detection circuit provided in this embodiment, as shown in FIG. 1, includes an input terminal L, an input terminal N, an output terminal LO and an output terminal NO, and also includes a main switch S, a drive module 01, a switch module 02 and a circuit breaker 23, the drive module 01 is provided with an S1 sensing terminal and an S2 sensing terminal, and the S1 sensing terminal is signal-connected with the S2 sensing terminal; the input terminal L is connected to the output terminal LO through the main switch S, and the input terminal N is connected to the output terminal NO through the main switch S; the input end of the drive module 01 is connected to the output terminal LO, and the output end of the drive module 01 is connected to the control end of the switch module 02. The drive module 01 is used to control the switch module 02 according to the signal of whether the S1 sensing end and the S2 sensing end are connected. 02 on and off; the input end of the switch module 02 is connected to the output terminal LO, the output end of the switch module 02 is connected to a voltage end of the circuit breaker 23, the other voltage end of the circuit breaker 23 is connected to the output terminal NO and the circuit breaker. The control terminal of 23 is connected with the control terminal of the main switch S and is used to control the on and off of the main switch S.

Specifically, as shown in FIG. 1, this embodiment does not need to use an inductive device such as a transformer, but sets the S1 inductive end and the S2 inductive end for signal connection. The terminal is connected to the S2 sensing terminal. Since the leakage current detection circuit of this embodiment can be optionally applied to the plug and socket, the output of the plug is generally a cable, so in the long-term use process, the cable may be broken and other problems may lead to leakage current Therefore, the above-mentioned induction connection line can be set in the cable, and the length can be set according to the cable, which is not limited in this embodiment. If the connection line is broken, the S1 sensing end and the S2 sensing end are disconnected, which means that the wire used for current and voltage transmission in the cable may also be disconnected, so the signal between the S1 sensing end and the S2 sensing end can be passed. Connect or disconnect to determine whether leakage current is generated, and then control the on and off of the switch module 02 through the drive module 01, and then control the circuit breaker 23 to work, generate a circuit breaker signal to disconnect the main switch S, thereby turning off the output voltage and ensuring the use of electrical safety.

Figure 2:
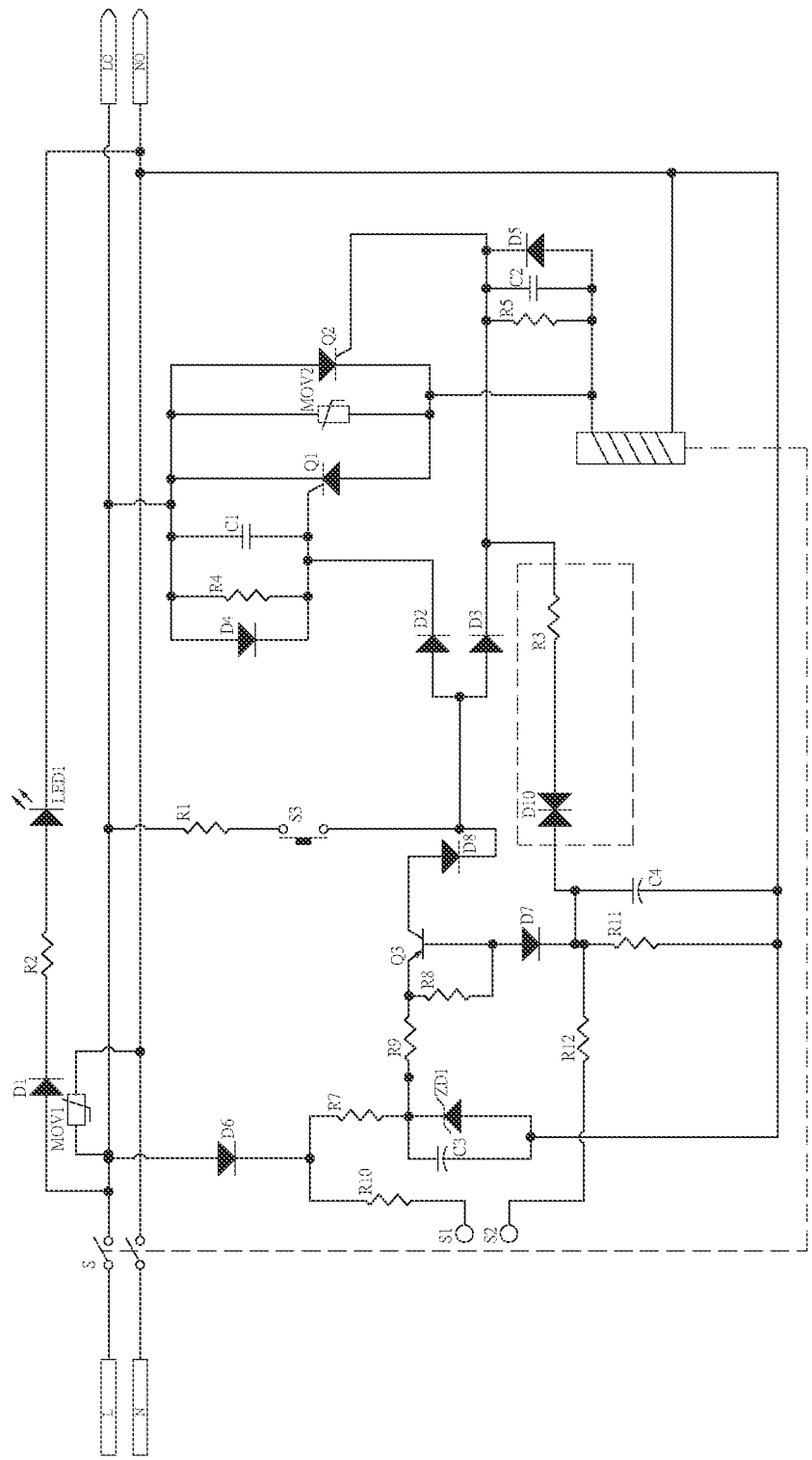
FIG. 2 is a circuit schematic diagram of Embodiment 1 of the present invention.

The specific circuit schematic diagram of this embodiment is shown in FIG. 2, the switch module 02 includes a switch tube Q1 and a switch tube Q2; a switch end of the switch tube Q1 is connected to a voltage end of the circuit breaker 23, and the other end of the switch tube Q1 A switch terminal is connected to the output terminal LO, the control terminal of the switch tube Q1 is connected to the output terminal of the drive module 01; a switch terminal of the switch tube Q2 is connected to a voltage terminal of the circuit breaker 23, and the other switch terminal of the switch tube Q2 is connected to the output terminal LO is connected, and the control end of the switch tube Q2 is connected to the output end of the driving module 01. Among them, the switch tube Q1 and the switch tube Q2 are preferably thyristors, and the connection mode of the cathode, the anode and the control terminal of the switch tube Q1 and the switch tube Q2 is shown in FIG. 2.

The driving module 01 of this embodiment includes a switch tube Q3, a resistor R5, a resistor R7, a resistor R9, a resistor R11, a resistor R10, a diode D7 and a diode D6, and is also provided with corresponding auxiliary devices, such as a capacitor C3, a Zener diode ZD1 resistor R12, resistor R8, diode D2, diode D3, etc. The specific connection method is shown in FIG. 2; one end of the resistor R7 is connected to the output terminal Q3 LO through the diode D6, and the other end of the resistor R7 is connected to the switch tube Q3 through the resistor R9. One switch terminal of the switch tube is connected to the control terminal of the switch module 02, the other switch terminal of the switch tube Q3 is connected to the output terminal NO through the diode D7 and the resistor R11 in turn, and the two ends of the resistor R5 are respectively connected to the output terminal NO. A voltage end of the circuit breaker 23 is connected to the other switch end of the switch tube Q3; the S1 sensing end is connected to one end of the resistor R7 through the resistor R10, and the S2 sensing end is connected to the cathode of the diode D7.

Specifically, the working principle of this embodiment is:

When the S1 sensing terminal and the S2 sensing terminal are normally connected, the output terminal LO and the output terminal NO output voltage signal normally.

When the connection between the S1 sensing terminal and the S2 sensing terminal is disconnected, it means that leakage current may be generated. At this time, the circuit where the resistor R5, the resistor R7, the resistor R9, the resistor R11, and the diode D7 are located makes the switch tube Q3 turn on. The switch tube Q3 makes the switch tube Q1 and the switch tube Q2 turn on, and then causes the two voltage terminals of the circuit breaker 23 to generate a pressure difference signal, and the circuit breaker 23 generates a magnetic adsorption main switch S, so that the main switch S is tripped, that is, the circuit breaker 23 is disconnected. Open the connection between the input terminal L and the output terminal LO, the input terminal N and the output terminal NO, thereby disconnecting the voltage output of the line and ensuring the safety of the line and electricity.

When the inductive connection line between the S1 inductive end and the S2 inductive end generates an electrical connection signal with the live wire cable and the neutral wire cable where the input terminal L and the input terminal N are located, that is, in this embodiment, the input terminal L and the input terminal N are connected. The outer periphery of the live wire cable and the neutral wire cable is wrapped with a conductive layer, such as a conductive layer made of graphene, and the conductive layer is connected with the signal of the sensing wire, resulting in a short-circuit signal between the live wire and/or the neutral wire and the conductive layer, and then the live wire and/or the neutral wire will generate a short-circuit signal with the sensing connection wire. At this time, the resistor R5, resistor R7, resistor R9, resistor R11, and diode D7 are located. The circuit turns on the switch tube Q3, and the turned on switch tube Q3 makes both the switch tube Q1 and the switch tube Q2 turn on, so it can also control the circuit breaker 23 to generate a pressure difference and drive the main switch S to trip to ensure electricity safety.

The drive module 01 is provided with a diode D10 and a resistor R3. When the live wire breaks and the conductive layer generates a short-circuit signal, and then generates a short-circuit signal with the induction connection line, the switch tube Q2 is turned on through the diode D10 and the resistor R3, thereby making the circuit open. A voltage difference is generated across the two ends of the device 23, and the main switch S is controlled to be disconnected to cut off the voltage output.

Furthermore, the present embodiment is also provided with a switch S3 for testing whether the circuit leakage current detection function is normal. As shown in FIG. 2, pressing the switch S3 can simulate the output of the control signal from the drive module 01 to control the switch tube Q1 and the switch tube. Q2 is turned on, so as to detect whether the main switch S will trip, so as to detect whether the leakage current detection and power-off functions of this embodiment are normal.

Embodiment 2

Figure 3:
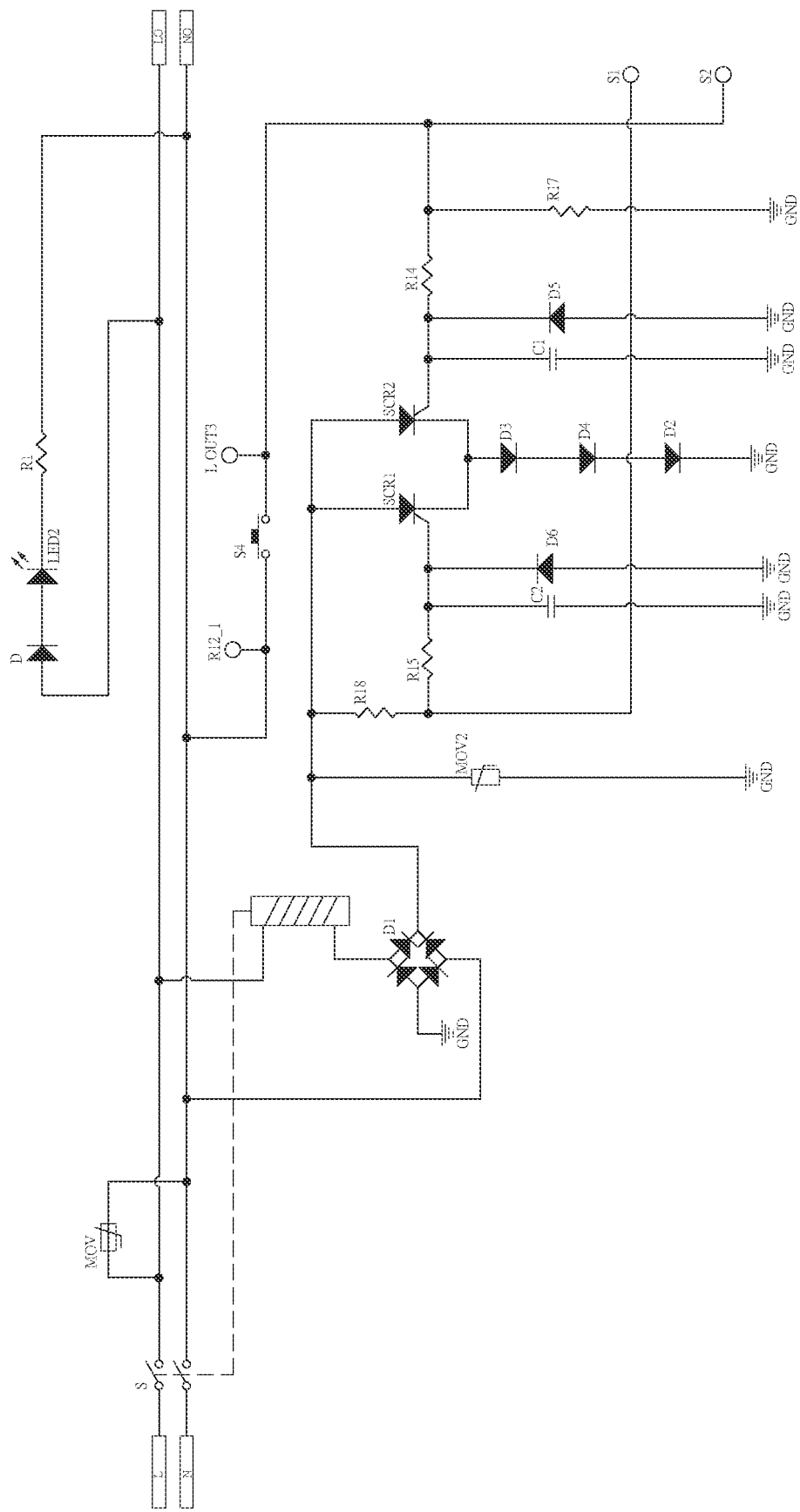
FIG. 3 is a circuit schematic diagram of Embodiment 2 of the present invention.
Figure 4:
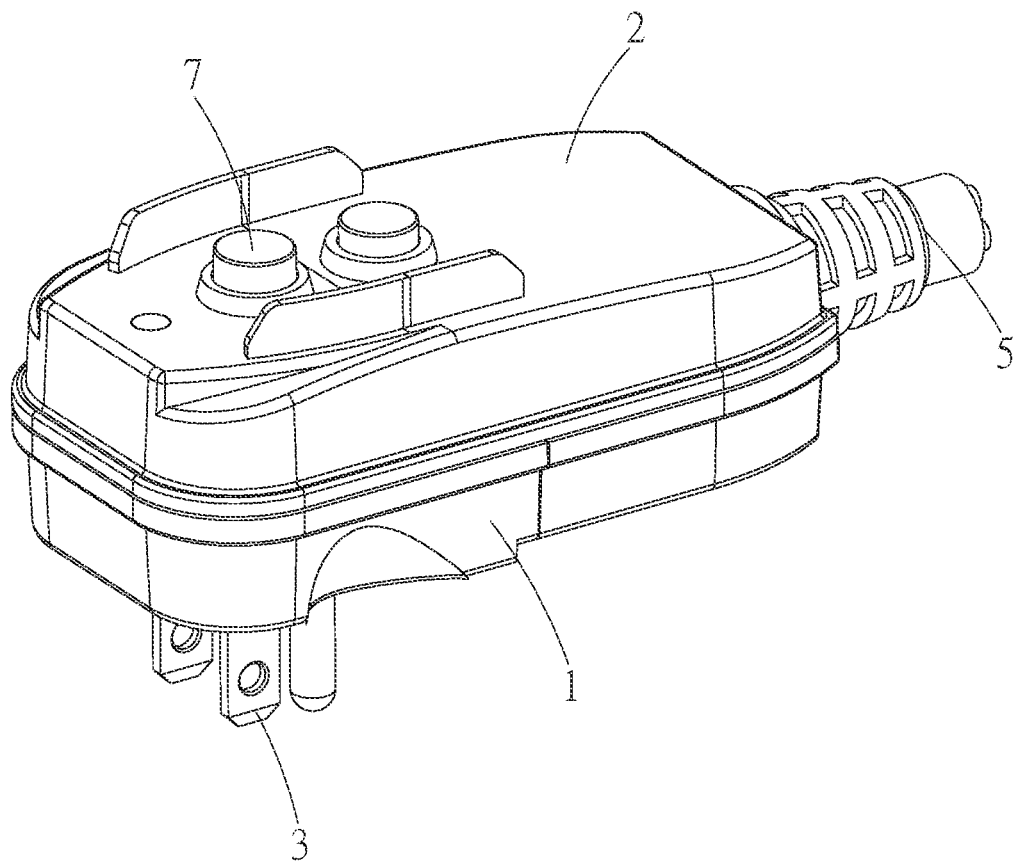
FIG. 4 is the structural representation of the present invention.
Figure 5:
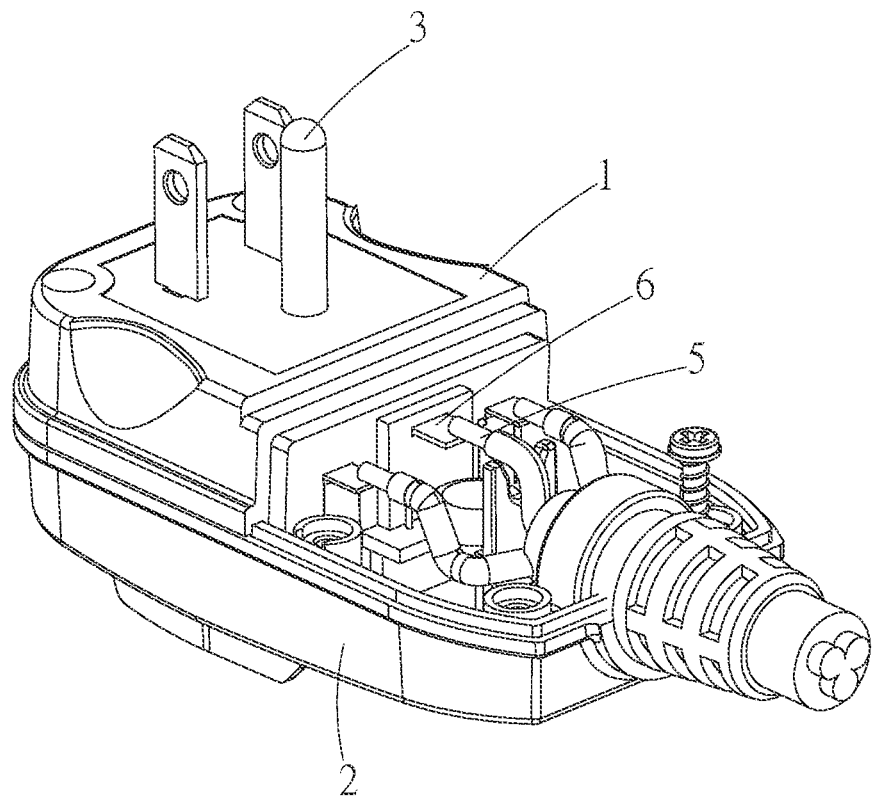
FIG. 5 is a schematic structural diagram of the hidden part of the present invention after the upper casing.

As shown in FIG. 3, which is a specific circuit schematic diagram of this embodiment, the input terminal N is connected to a rectifier D1 through the main switch S. The driving module 01 of this embodiment includes a resistor R15, a resistor R18, a resistor R14 and a resistor R17. The switch module 02 includes a diode SCR1 and a diode SCR2, the anode of the diode SCR1 is connected to the output of the rectifier D1, the cathode of the diode SCR1 is grounded, the control end of the diode SCR1 is connected to the output end of the drive module 01, the anode of the diode SCR2 is connected to the output of the rectifier D1, the cathode of the diode SCR2 is grounded, and the control end of the diode SCR2 is connected to the output end of the drive module 01;

the output of the rectifier D1 is connected to the control end of the diode SCR1 after passing through the resistor R18 and the resistor R15 in turn, and the end of the resistor R18 and the resistor R15 is connected to the S1. The sensing terminal is connected; the control terminal of the diode SCR2 is grounded through the resistor R14 and the resistor R17 in turn, and the connection terminal of the resistor R14 and the resistor R17 is connected to the S2 sensing terminal. The specific connection method is shown in FIG. 3. The S1 sensing terminal and the inductive end of S2 is also connected through an inductive connection line, and the difference from the first embodiment is the circuit connection mode of the drive module 01 and the switch module 02.

The specific working principle of this embodiment is as follows:

When the S1 sensing terminal and the S2 sensing terminal are connected normally, the output voltage is normally provided.

When the connection between the S1 inductive terminal and the S2 inductive terminal is disconnected, the diode SCR1 is turned on by the voltage division of the resistor R18 and the resistor R17, at this time, a voltage difference is generated between the two ends of the circuit breaker 23, and then the main switch S is controlled to trip and cut off the voltage output.

When the live wire or the neutral wire and the conductive layer generate a short-circuit signal, the live wire or the neutral wire also generates a short-circuit signal with the induction connection wire. At this time, the voltage is divided by the resistor R14 and the resistor R17, so that the diode SCR2 is turned on, so that the circuit breaker 23. There is a pressure difference between the two ends of the switch, which controls the main switch S to trip, cuts off the voltage output, and ensures the safety of the line.

Further, the present embodiment is also provided with a switch S4 for testing whether the leakage current detection function of the circuit is normal. As shown in FIG. 3, pressing the switch S4 can simulate the output of the control signal from the drive module 01 and control the conduction of the diode SCRC2, and then detect. Whether the main switch S will trip, so as to detect whether the leakage current detection and power-off functions of this embodiment are normal.

The circuit structure of this embodiment is simple, the wiring arrangement of the circuit board is easy, and there are few components, so that the volume of this embodiment is smaller.

A leakage current detection device provided in this embodiment as shown in FIG. 4 to FIG. 7, includes a casing and a plurality of pins 3, and also includes a control circuit board 4 disposed in the casing, a leakage detection circuit breaker assembly, a plurality of cable connectors 5, and a number of conductive output parts 6, the control circuit board is provided with the circuit of the first or second embodiment, wherein a number of pins are respectively connected to the input terminal L and the input terminal N, and a number of cable connectors are respectively connected to the output terminal LO and the output terminal NO are connected, and the conductive output member 6 corresponds to the main switch S. The conductive output member 6 is signal-connected with the control circuit board 4, the shell is provided with a button 7, and the leakage detection circuit breaker assembly is signal-connected with the control circuit board 4; the leakage detection circuit breaker assembly is used to control the button 7 to be disconnected when leakage current is generated; a number of conductive The output piece 6 is in one-to-one correspondence with a number of pins 3, the button 7 is used to control whether one end of the conductive output piece 6 is signally connected to the pin 3, and the other end of the conductive output piece 6 is welded with the cable connector 5.

Figure 6:
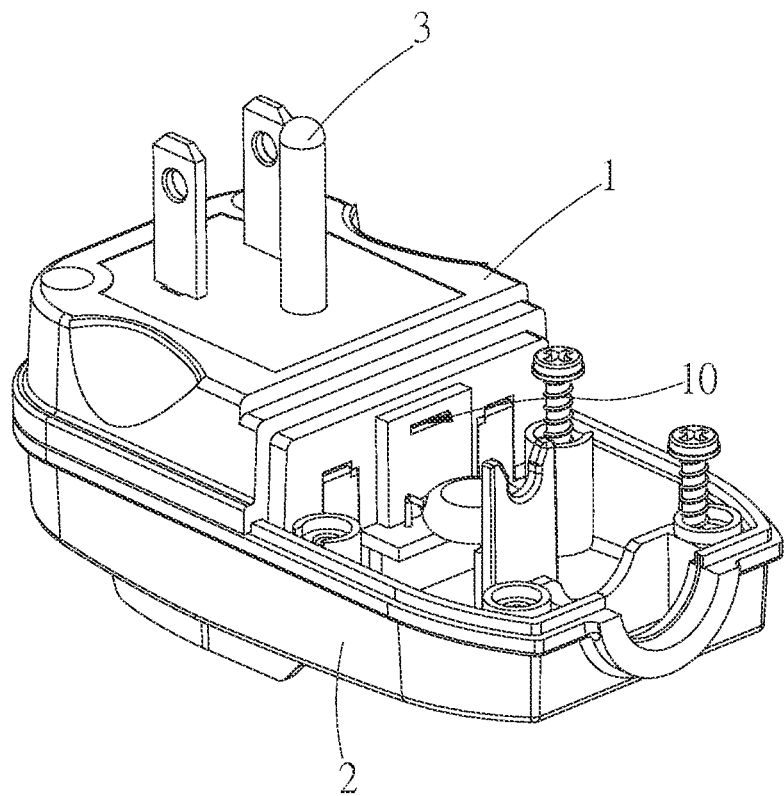
FIG. 6 is a schematic structural diagram of the present invention after the hidden part of the upper casing and the cable connector.
Figure 7:
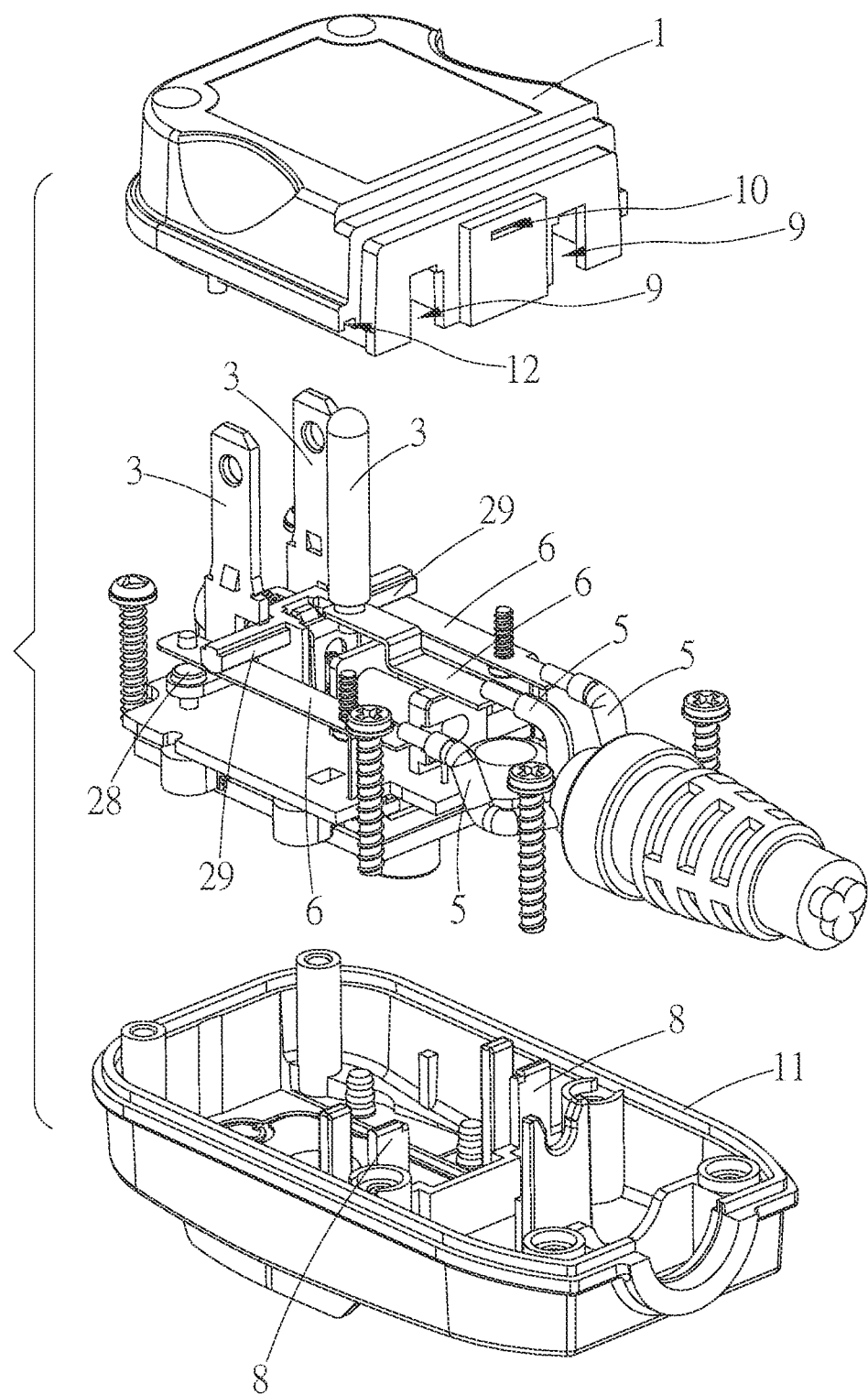
FIG. 7 is the exploded structure schematic diagram of the present invention.

Specifically, the conductive output member 6 is installed on the outer casing, and the optional installation method is shown in FIG. 6 and FIG. 7, wherein the outer casing includes an upper casing 1 and a lower casing 2, the lower casing 2 is protruded with a fixing column 8, and the upper casing 1 is provided with a groove 9, the fixing column 8 is assembled in the groove 9 and forms a catch 10 with the bottom of the groove 9, and the other end of the conductive output piece 6 is inserted into the catch 10, so the other end is stably fixed in the casing after passing through the card position 10. Therefore, the structure of this embodiment except the cable connector 5 can be produced independently. At the same time, the cable connector 5 can also be produced independently. The cable connector 5 is welded to the junction of the conductive output member 6, and the welding method is such as butt welding, so the production and assembly of this embodiment are more convenient, and the efficiency is also improved.

Figure 8:
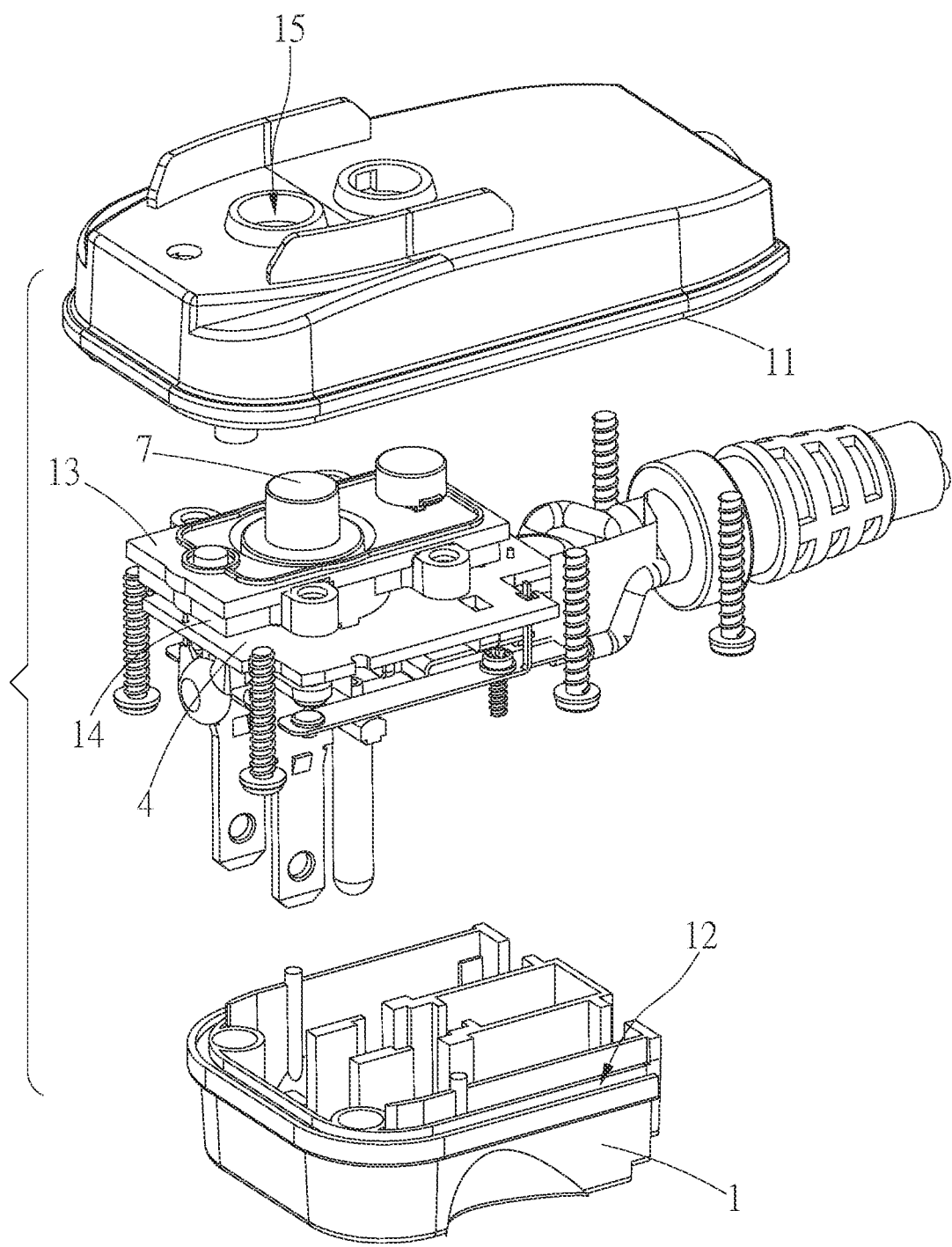
FIG. 8 is a schematic diagram of an exploded structure from another perspective of the present invention.

Further, as shown in FIGS. 7 and 8, the lower shell 2 is protruded with a rib ring 11, the upper shell 1 is provided with a connecting groove 12, and the rib ring 11 is assembled in the connecting groove 12 after the upper shell 1 and the lower shell 2 are assembled.

Specifically, through the cooperating arrangement of the rib ring 11 and the connecting groove 12, the assembly of the casing can be more stable and have better sealing performance, and a sealing ring can be further arranged in the connecting groove 12 to improve the sealing and waterproofing effect.

In a leakage current detection device provided in this embodiment, as shown in FIGS. 8 to 12, a waterproof component is installed in the casing, and the waterproof component includes a waterproof gasket 13; a fixed seat 14 is installed in the casing, and the fixed seat 14 is detachably installed on the lower shell 2, the waterproof gasket 13 is installed between the fixed seat 14 and the lower shell 2, the lower shell 2 is provided with a button hole 15 for the button 7 to be exposed, and the waterproof gasket 13 is used to connect the button hole 15 to the inner space of the shell.

Figure 9:
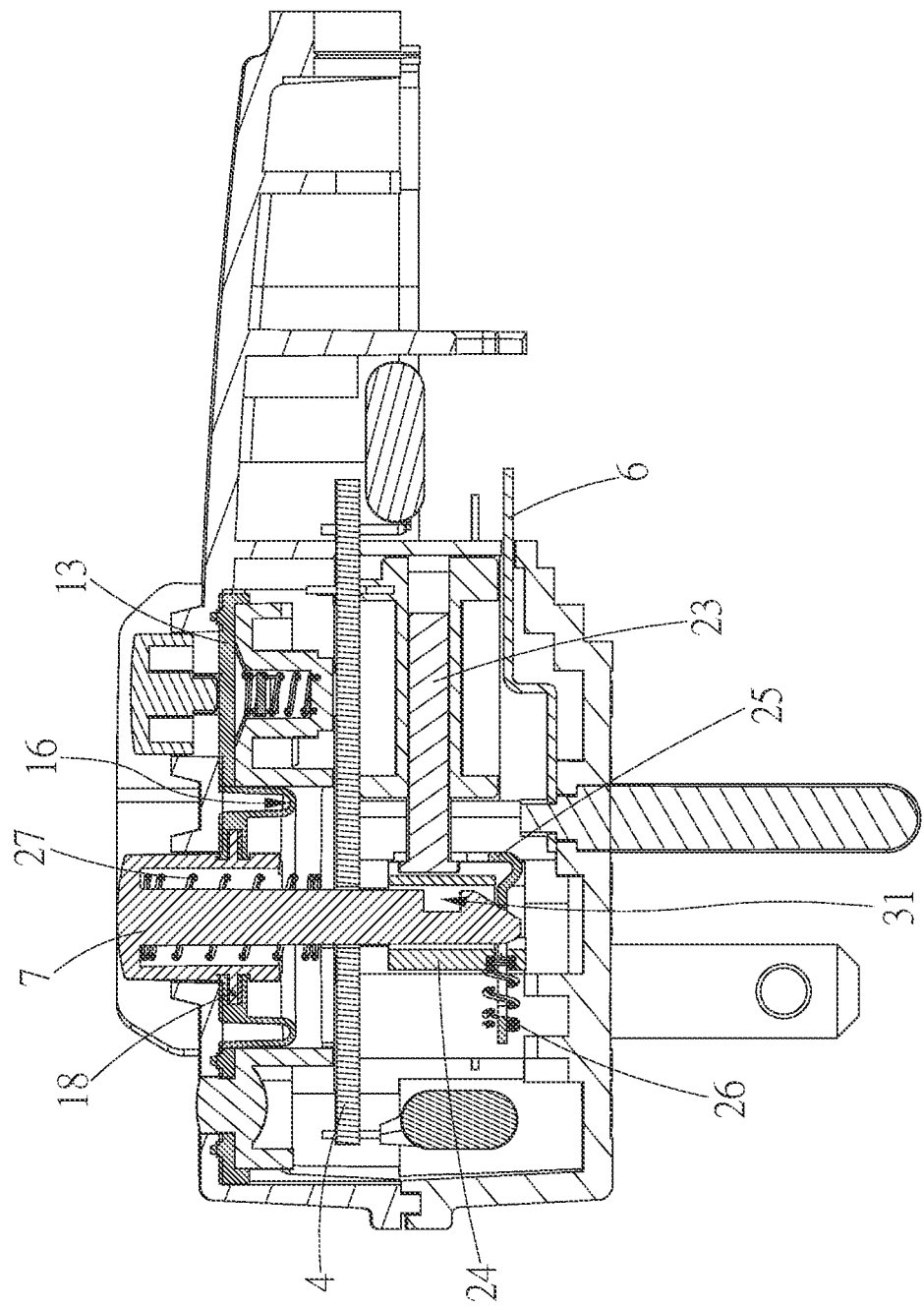
FIG. 9 is the sectional view one of the present invention.
Figure 10:
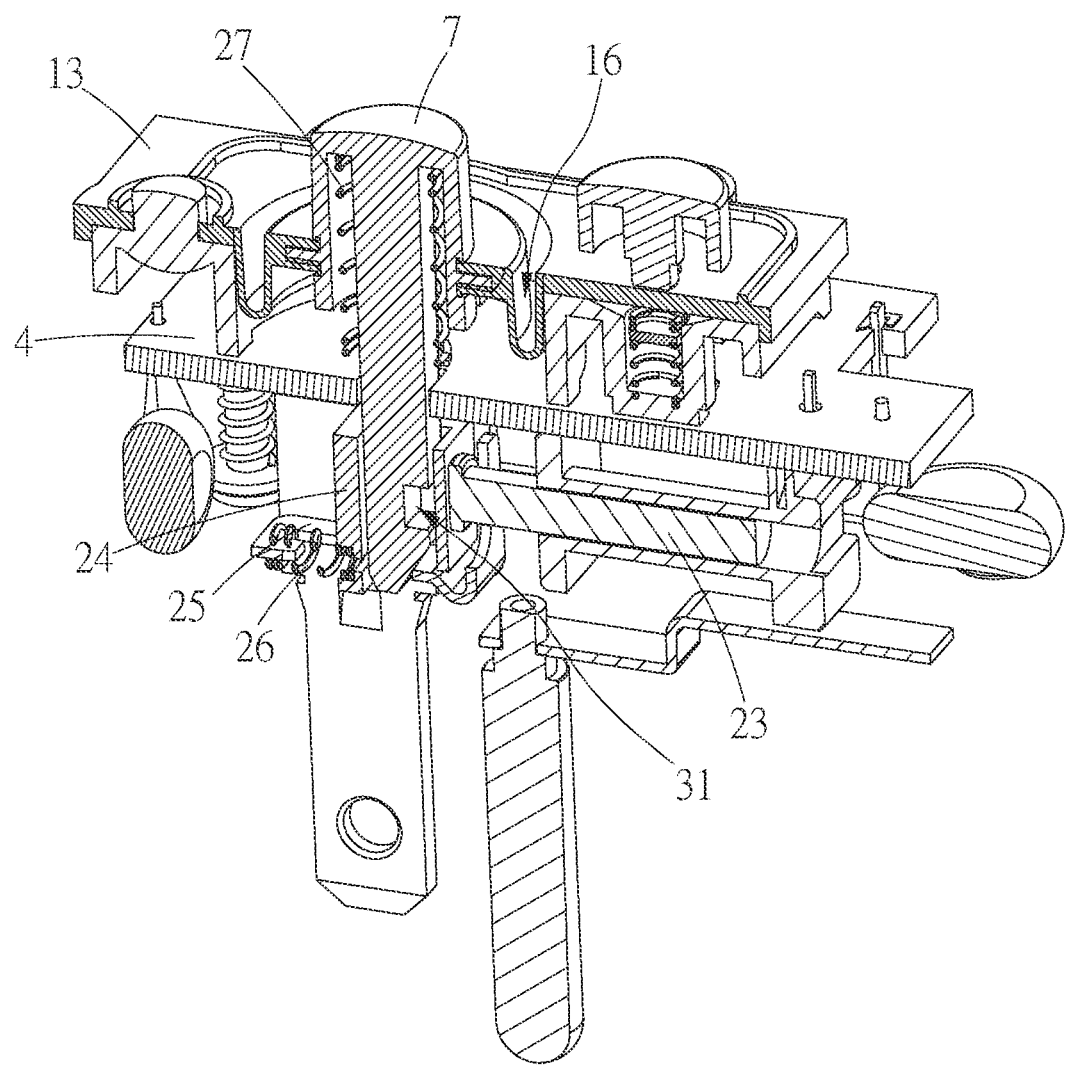
FIG. 10 is a sectional view two of the present invention.

Specifically, the assembly of the button 7 in this embodiment is also provided with a waterproof component. The structure is shown in FIG. 10. The U-shaped elastic ring 16 is provided with a through hole 17, the hole wall of the through hole 17 is provided with a limiting groove 19, and the outer periphery of the button 7 is provided with a limiting ring 18. Therefore, in the direction of FIG. 9 and FIG. 10, when the button 7 is pressed up and down, the button 7 not be separated from the waterproof gasket 13 due to the limitation of the position ring 18, and because the U-shaped elastic ring 16 has Elastic, can be stretched up and down with the button 7, does not limit the function of the button 7, and can maintain the waterproof effect.

Figure 11:
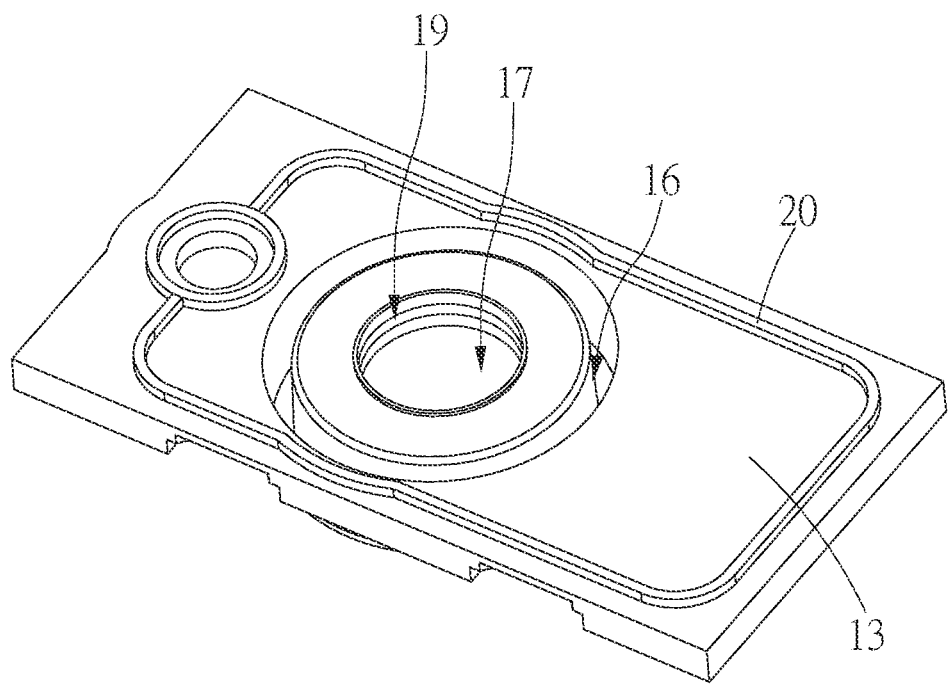
FIG. 11 is the structural schematic diagram of the waterproof gasket of the present invention.

Further, as shown in FIGS. 10 and 11, the waterproof gasket 13 is protruded with a sealing rib 20, and the sealing rib 20 is used to abut against the inner wall of the lower casing 2, thereby increasing the sealing and waterproof performance between the waterproof gasket 13 and the outer casing.

Figure 12:
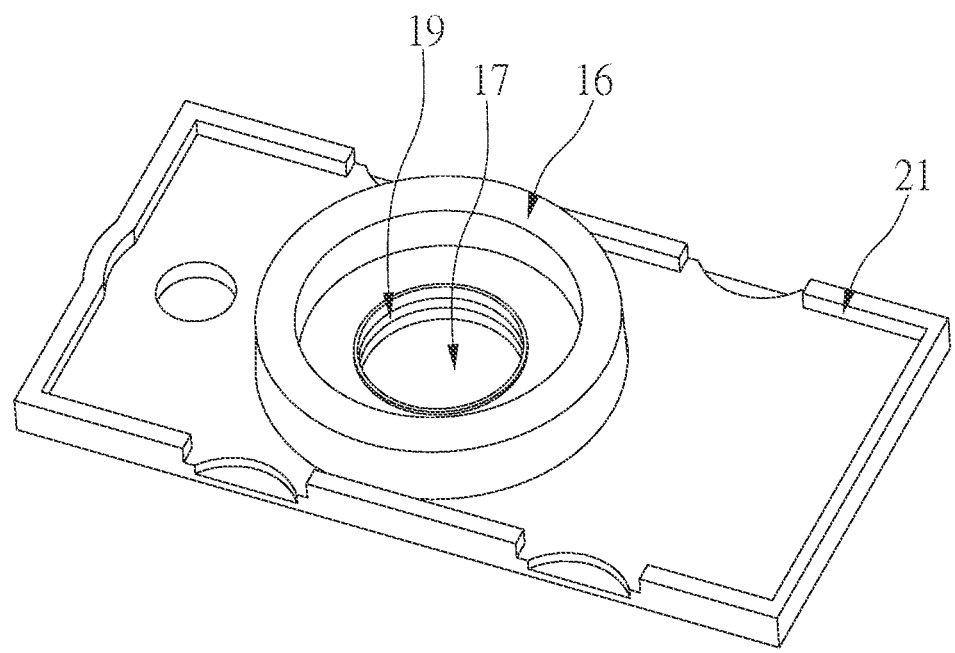
FIG. 12 is a schematic structural diagram of the waterproof gasket concealed the present invention from another perspective.
Figure 13:
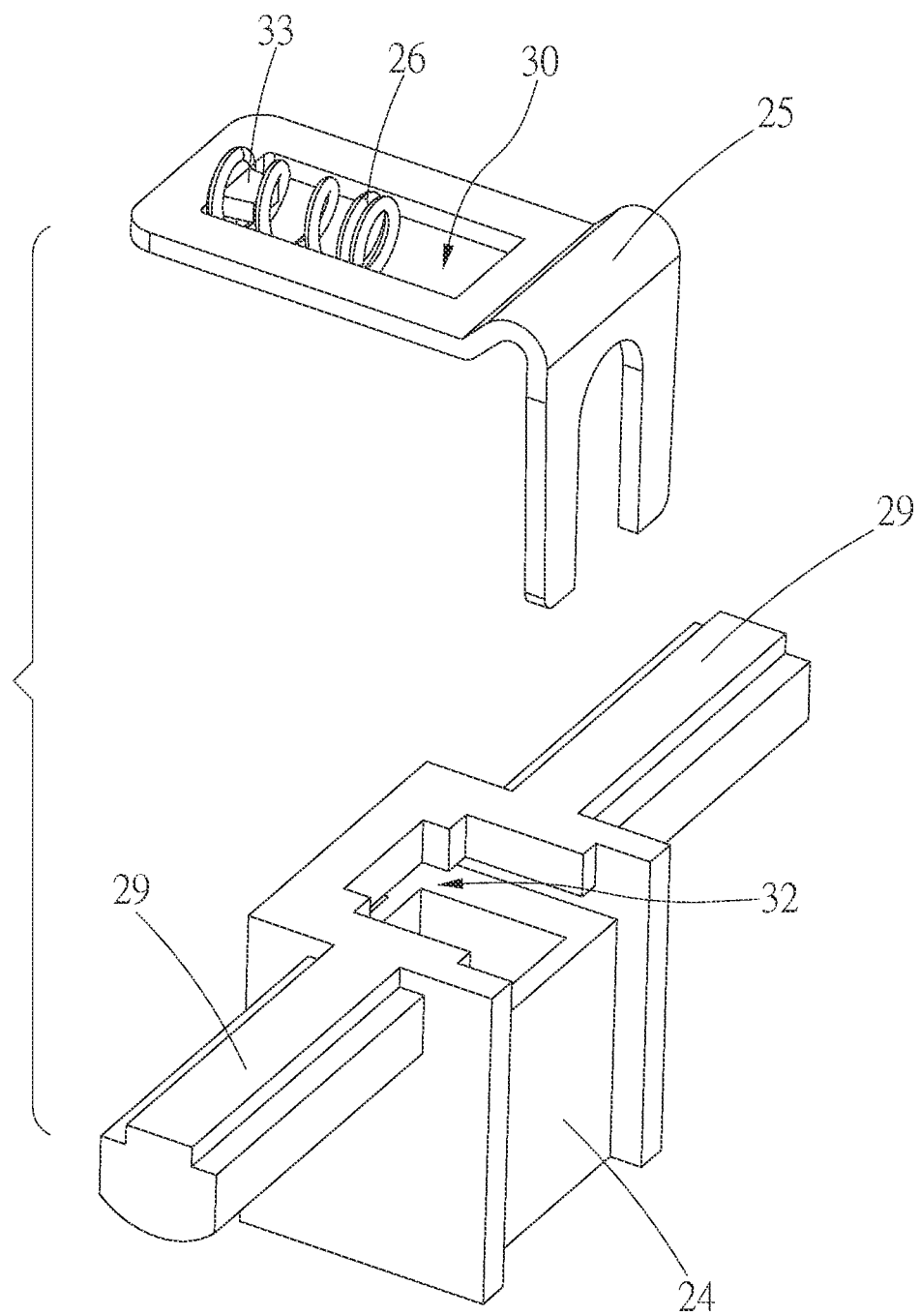
FIG. 13 is a schematic diagram of the exploded structure of the hidden connecting piece, the connecting restoring piece and the circuit breaker bracket of the present invention.

Further, as shown in FIG. 12, the side of the waterproof gasket 13 in contact with the fixing seat 14 is protruded with a surrounding ring 21. The surrounding ring 21 forms an installation groove (not shown in the drawing), and the fixing seat 14 is limited in the installation groove. Therefore, the stability of the assembly between the fixed seat 14 and the waterproof gasket 13 can be ensured. After the fixed seat 14 is assembled to the casing, the position of the waterproof gasket 13 can be fixed at the same time, so as to prevent the waterproof gasket 13 from being displaced and affecting the waterproofing effect.

A leakage current detection device provided in this embodiment as shown in FIG. 7 to FIG. 10, the leakage detection circuit breaker assembly includes a circuit breaker 23, a circuit breaker bracket 24, a connector 25, a connection reset component 26 and a button reset component 27, and the pins 3 are provided with fixed contact 28; the button reset member 27 is sleeved on the outer periphery of the button 7 and is used to reset the button 7, and the connection reset member 26 is used to reset the connection member 25, wherein the circuit breaker 23 can specifically be an electromagnet and is provided in the power circuit. When the leakage current occurs, the two ends of the circuit breaker 23 generate a voltage difference, and then magnetism occurs, and the generated magnetism can attract the connecting piece 25 and make the connecting piece 25 move; the circuit breaker 23 is installed on the control circuit board 4 and it is signal-connected with the control circuit board 4, the connector 25 is movably installed on the circuit breaker bracket 24, and the output end of the circuit breaker 23 is installed on the connector 25 and is used to drive the connector 25 to move; both sides of the circuit breaker bracket 24 are installed. There is a control arm 29, a drive slot 30 is formed on the connector 25, and a card slot 31 is formed at the bottom of the button 7; when the button 7 is closed, the groove wall of the drive slot 30 is clamped in the card slot 31 and the button 7 drives the connector 25 to move the connecting member 25 is used to drive the circuit breaker support 24 to move, and the control arm 29 of the circuit breaker support 24 is used to drive the conductive output member 6 to contact the fixed contact 28. Optionally, the circuit breaker bracket 24 is provided with a through slot 32, the connecting piece 25 is movably assembled in the through slot 32, the connecting piece 25 is provided with a limiting bump 33, and one end of the connecting reset piece 26 is sleeved on the limiting bump 33, and the connection is reset. The other end of the piece 26 abuts against the circuit breaker bracket 24.

Specifically, the control circuit board 4 of this embodiment is designed with a corresponding leakage detection circuit and leakage detection elements, such as mutual inductance coils, to sense whether there is leakage current in the live wire and the neutral wire. During normal operation, as shown in FIG. 9, when the button 7 is pressed and the button 7 is lowered, the slope at the bottom of the button 7 will squeeze the connecting piece 25 to move, and be stuck into the slot 31 of the button 7, so the button 7, during the reset process, the connecting piece 25 will be driven to move up, and the connecting piece 25 will drive the circuit-breaker support 24 to move upward, so that the two control arms 29 of the circuit-breaker support 24 will press the conductive output piece 6 up, so that the conductive output piece 6 is connected to the pin. The fixed contact 28 of 3 contacts, connects the pin 3 and the cable connector 5, and generates an output voltage. When the leakage current is generated, the leakage detection element of the control circuit board 4 will generate an induction signal, the circuit breaker 23 will generate magnetism and move to the right in the direction shown in the figures. The button 7 is separated, and the button 7 is reset under the driving of the button reset member 27, so the connecting member 25 and the circuit breaker bracket 24 are also moved down to reset, and the connecting member 26 is connected to the left to reset the connecting member 25, and the conductive output member 6 is not connected with the fixed contact. The point 28 is in contact, the pin 3 is not connected to the cable connector 5, so no output voltage and current are generated, which makes the electrical equipment connected to the leakage current detection circuit breaker 23 of this embodiment safer and reduces the occurrence of safety accidents.

The above are only preferred embodiments of the present invention, and are not intended to limit the present invention in any form. Although the present invention is disclosed as above with preferred embodiments, it is not intended to limit the present invention. Technicians, within the scope of the technical solution of the present invention, make some changes or modifications to equivalent examples of equivalent changes by using the technical content disclosed above, but if they do not depart from the content of the technical solution of the present invention, according to the present invention Technology refers to any simple modifications, equivalent changes and modifications made to the above embodiments, all within the scope of the technical solutions of the present invention.

The invention claimed is:

1. A leakage current detection circuit comprising: an input terminal L, an input terminal N, an output terminal LO, an output terminal NO, a main switch S, a drive module, a switch module and a circuit breaker, wherein the drive module is provided with an S1 sensing end and an S2 sensing end, and the S1 sensing end and the S2 sensing end are in signal connection;

the input terminal L is connected to the output terminal LO through the main switch S, and the input terminal N is connected to the output terminal NO through the main switch S;

an input end of the drive module is connected to the output terminal LO, an output end of the drive module is connected to a control end of the switch module, and the drive module is used to control on and off of the switch module according to a signal indicating whether the S1 sensing end and the S2 sensing end are connected; an input end of the switch module is connected to the output terminal LO, an output end of the switch module is connected to a voltage end of the circuit breaker, the other voltage end of the circuit breaker is connected to the output terminal NO, and a control end of the circuit breaker is connected to a control end of the main switch S and used to control the on and off of the main switch S, the input terminal N is connected to a rectifier D1 through the main switch S, the switch module includes a diode SCR1 and a diode SCR2, an anode of the diode SCR1 is connected to an output of the rectifier D1, a cathode of the diode SCR1 is grounded, and a control end of the diode SCR1 is connected to the output end of the drive module, the anode of the diode SCR2 is connected to the output of the rectifier D1, the cathode of the diode SCR2 is connected to the ground, and a control end of the diode SCR2 is connected to the output end of the drive module, the drive module includes a resistor R15, a resistor R18, a resistor R14 and a resistor R17, the output of the rectifier D1 is connected to the control terminal of the diode SCR1 after passing through the resistor R18 and the resistor R15 in sequence, the control terminal of the diode SCR2 is grounded through the resistor R14 and the resistor R17 in turn, and the connection terminal of the resistor R14 and the resistor R17 is connected to the S2 sensing terminal.

2. The leakage current detection circuit as claim 1, wherein a first cable is connected between the input terminal L and the output terminal LO, and a second cable is connected between the input terminal N and the output terminal NO, the outer circumference of each of the first cable and the second cable is wrapped with a conductive layer, and the conductive layer is connected to the S1 sensing terminal or S2 sensing terminal.

3. A leakage current detection device, comprising a casing and a plurality of pins, a control circuit board, a plurality of cable connectors and a plurality of conductive output parts arranged in the casing, wherein the control circuit board comprises the above circuit described in claim 2;
the plurality of pins are respectively connected to the input terminal L and the input terminal N, the plurality of cable connectors are respectively connected to the output terminal LO and the output terminal NO, and the conductive output member is the main switch S;
a plurality of the conductive output pieces are in one-to-one correspondence with a plurality of the pins, one end of the conductive output piece is used for signal connection with the pin, and the other end of the conductive output piece is welded with the cable connector;
the outer shell includes an upper shell and a lower shell, the lower shell is protruded with a fixing column, the upper shell is provided with a groove, and the fixing column is assembled in the groove and forms a locking position with the groove bottom of the groove, the other end of the conductive output piece is inserted into the card position.

4. The leakage current detection device as claim 3, further comprising: a button arranged on the casing, wherein the button is used to control whether the conductive output member is connected with the pin and outputs a voltage and current signal;
a waterproof assembly is installed in the casing, and the waterproof assembly includes a waterproof gasket; a fixing seat is installed in the outer casing, the fixing seat is detachably installed on the lower casing, and the waterproof gasket is installed on the lower casing, between the fixing seat and the lower shell, the lower shell is provided with a button hole for the button to be exposed, and the waterproof gasket is used for sealing and isolating the button hole and the inner space of the shell; the waterproof gasket is equipped with a U-shaped elastic ring, the U-shaped elastic ring is provided with a through hole, the hole wall of the through hole is provided with a limiting groove, the outer periphery of the button is equipped with a limiting ring, and the button after passing through the through hole, the limiting ring is assembled in the limiting groove; the waterproof gasket is protruded with a sealing rib, and the sealing rib is used to abut against the inner wall of the lower case.

5. The leakage current detection device as claim 4, further comprising: a leakage detection circuit breaker assembly, wherein the leakage circuit breaker assembly includes a circuit breaker bracket, a connector, a connection reset component and a button reset component, the pins are provided with fixed contacts; the button reset component is sleeved on the periphery of the button and used to reset the button, and the connection reset piece is used to reset the connection piece;
the circuit breaker is installed on the control circuit board and is signally connected to the control circuit board, the connector is movably installed on the circuit breaker bracket, and the output end of the circuit breaker is installed on the connector and used to drive the movement of the connector; both sides of the circuit breaker support are provided with control arms, the connecting piece is provided with a driving slot, and the bottom of the key is provided with a clamping slot; when the key is closed, the slot wall of the driving slot is clamped in the position, the connecting piece is used to drive the circuit breaker support to move, and the control arm of the circuit breaker support is used to drive the conductive output piece to contact the fixed contact.

6. A leakage current detection device, comprising a casing, a plurality of pins, a control circuit board, a plurality of cable connectors and a plurality of conductive output parts arranged in the casing, wherein the control circuit board comprises the above circuit described in claim 1;
the plurality of pins are respectively connected to the input terminal L and the input terminal N, the plurality of cable connectors are respectively connected to the output terminal LO and the output terminal NO, and the conductive output member is the main switch S;
a plurality of the conductive output pieces are in one-to-one correspondence with a plurality of the pins, one end of the conductive output piece is used for signal connection with the pin, and the other end of the conductive output piece is welded with the cable connector;
the outer shell includes an upper shell and a lower shell, the lower shell is protruded with a fixing column, the upper shell is provided with a groove, and the fixing column is assembled in the groove and forms a locking position with the groove bottom of the groove, the other end of the conductive output piece is inserted into the card position.

7. The leakage current detection circuit as claim 6, further comprising: a button arranged on the casing, wherein the button is used to control whether the conductive output member is connected with the pin and outputs a voltage and current signal;
a waterproof assembly is installed in the casing, and the waterproof assembly includes a waterproof gasket; a fixing seat is installed in the outer casing, the fixing seat is detachably installed on the lower casing, and the waterproof gasket is installed on the lower casing, between the fixing seat and the lower shell, the lower shell is provided with a button hole for the button to be exposed, and the waterproof gasket is used for sealing and isolating the button hole and the inner space of the shell;
the waterproof gasket is equipped with a U-shaped elastic ring, the U-shaped elastic ring is provided with a through hole, the hole wall of the through hole is provided with a limiting groove, the outer periphery of the button is equipped with a limiting ring, and the button after passing through the through hole, the limiting ring is assembled in the limiting groove; the waterproof gasket is protruded with a sealing rib, and the sealing rib is used to abut against the inner wall of the lower case.

8. The leakage current detection device as claim 7, further comprising: a leakage detection circuit breaker assembly, wherein the leakage circuit breaker assembly includes a circuit breaker bracket, a connector, a connection reset component and a button reset component, the pins are provided with fixed contacts; the button reset component is sleeved on the periphery of the button and used to reset the button, and the connection reset piece is used to reset the connection piece;

the circuit breaker is installed on the control circuit board and is signally connected to the control circuit board, the connector is movably installed on the circuit breaker bracket, and the output end of the circuit breaker is installed on the connector and used to drive the movement of the connector; both sides of the circuit breaker support are provided with control arms, the connecting piece is provided with a driving slot, and the bottom of the key is provided with a clamping slot; when the key is closed, the slot wall of the driving slot is clamped in the position, the connecting piece is used to drive the circuit breaker support to move, and the control arm of the circuit breaker support is used to drive the conductive output piece to contact the fixed contact.

9. A leakage current detection device, comprising a casing, a plurality of pins, a control circuit board, a plurality of cable connectors, a plurality of conductive output parts arranged in the casing, and a button arranged on the casing, wherein the control circuit board comprises a leakage current detection circuit, the leakage current detection circuit comprising: an input terminal L, an input terminal N, an output terminal LO, an output terminal NO, a main switch S, a drive module, a switch module and a circuit breaker, the drive module is provided with an S1 sensing end and an S2 sensing end, and the S1 sensing end and the S2 sensing end are in signal connection, the input terminal L is connected to the output terminal LO through the main switch S, and the input terminal N is connected to the output terminal NO through the main switch S, an input end of the drive module is connected to the output terminal LO, an output end of the drive module is connected to a control end of the switch module, and the drive module used to control on and off of the switch module according to a signal indicating whether the S1 sensing end and the S2 sensing end are connected, an input end of the switch module is connected to the output terminal LO, an output end of the switch module is connected to a voltage end of the circuit breaker, the other voltage end of the circuit breaker is connected to the output terminal NO, and a control end of the circuit breaker is connected to the control end of the main switch S and used to control the on and off of the main switch S, the plurality of pins are respectively connected to the input terminal L and the input terminal N, the plurality of cable connectors are respectively connected to the output terminal LO and the output terminal NO, and the conductive output member is the main switch S, a plurality of the conductive output pieces are in one-to-one correspondence with a plurality of the pins, one end of the conductive output piece is used for signal connection with the pin, and the other end of the conductive output piece is welded with the cable connector, the outer shell includes an upper shell and a lower shell, the lower shell is protruded with a fixing column, the upper shell is provided with a groove, and the fixing column is assembled in the groove and forms a locking position with the groove bottom of the groove, the other end of the conductive output piece is inserted into the card position, the button is used to control whether the conductive output member is connected with the pin and outputs a voltage and current signal, a waterproof assembly is installed in the casing, and the waterproof assembly includes a waterproof gasket; a fixing seat is installed in the outer casing, the fixing seat is detachably installed on the lower casing, and the waterproof gasket is installed on the lower casing, between the fixing seat and the lower shell, the lower shell is provided with a button hole for the button to be exposed, and the waterproof gasket is used for sealing and isolating the button hole and the inner space of the shell;

the waterproof gasket is equipped with a U-shaped elastic ring, the U-shaped elastic ring is provided with a through hole, the hole wall of the through hole is provided with a limiting groove, the outer periphery of the button is equipped with a limiting ring, and the button after passing through the through hole, the limiting ring is assembled in the limiting groove; the waterproof gasket is protruded with a sealing rib, and the sealing rib is used to abut against the inner wall of the lower case.

10. The leakage current detection device as claim 9, further comprising: a leakage detection circuit breaker assembly, wherein the leakage circuit breaker assembly includes a circuit breaker bracket, a connector, a connection reset component and a button reset component, the pins are provided with fixed contacts; the button reset component is sleeved on the periphery of the button and used to reset the button, and the connection reset piece is used to reset the connection piece;

the circuit breaker is installed on the control circuit board and is signally connected to the control circuit board, the connector is movably installed on the circuit breaker bracket, and the output end of the circuit breaker is installed on the connector and used to drive the movement of the connector; both sides of the circuit breaker support are provided with control arms, the connecting piece is provided with a driving slot, and the bottom of the key is provided with a clamping slot; when the key is closed, the slot wall of the driving slot is clamped in the position, the connecting piece is used to drive the circuit breaker support to move, and the control arm of the circuit breaker support is used to drive the conductive output piece to contact the fixed contact.

11. The leakage current detection device as claim 9, wherein a first cable is connected between the input terminal L and the output terminal LO, and a second cable is connected between the input terminal N and the output terminal NO, the outer circumference of each of the first cable and the second cable is wrapped with a conductive layer, and the conductive layer is connected to the S1 sensing terminal or S2 sensing terminal.

* * * * *